(12) United States Patent
Sano et al.

(10) Patent No.: US 7,979,005 B2
(45) Date of Patent: Jul. 12, 2011

(54) ELECTRICALLY CONDUCTIVE PATTERN FORMING APPARATUS

(75) Inventors: Yuichiro Sano, Mito (JP); Toru Miyasaka, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 376 days.

(21) Appl. No.: 12/216,161

(22) Filed: Jun. 30, 2008

(65) Prior Publication Data
US 2008/0267680 A1   Oct. 30, 2008

(51) Int. Cl.
*G03G 15/16* (2006.01)
*G03G 15/11* (2006.01)
*G03G 15/10* (2006.01)

(52) U.S. Cl. ........ 399/237; 399/249; 399/251; 399/296; 430/48; 355/53

(58) Field of Classification Search .................... 399/237
See application file for complete search history.

(56) References Cited

U.S. PATENT DOCUMENTS

| | | | | |
|---|---|---|---|---|
| 4,671,309 A | * | 6/1987 | Iemura et al. | 399/57 |
| 4,892,798 A | * | 1/1990 | Lamanna et al. | 430/38 |
| 5,053,823 A | * | 10/1991 | Oh-ishi et al. | 399/251 |
| 5,887,226 A | * | 3/1999 | Taki | 399/92 |
| 7,228,092 B2 | * | 6/2007 | Nomura et al. | 399/249 |
| 2006/0072944 A1 | * | 4/2006 | Sharma et al. | 399/308 |

FOREIGN PATENT DOCUMENTS

| | | |
|---|---|---|
| JP | 11-251718 | 9/1999 |
| JP | 2002-527783 | 8/2002 |
| JP | 2004-048030 | 2/2004 |
| JP | 2006-278801 | 10/2006 |
| JP | 2007-173131 | 7/2007 |
| JP | 2008-016575 | 1/2008 |
| JP | 2008-034495 | 2/2008 |
| WO | WO 00/21690 | 4/2000 |

* cited by examiner

*Primary Examiner* — David M Gray
*Assistant Examiner* — David Bolduc
(74) *Attorney, Agent, or Firm* — Antonelli, Terry, Stout & Kraus, LLP.

(57) ABSTRACT

An electrically conductive pattern forming apparatus has process disposition which reduces contamination of a pattern or inside of the apparatus due to backflow and leakage of a liquid material such as a developing agent or a cleaning liquid. A developing device and a cleaning device in the electrically conductive pattern forming apparatus using an electrophotographic method are disposed in a lower region about the center of a photoreceptor, a solvent removing process is disposed in a region in which the photoreceptor rotates upward, and a transfer liquid applying process and an electrostatic transfer process are disposed above the center of the photoreceptor and in a region in which the photoreceptor rotates downward.

3 Claims, 3 Drawing Sheets

ELECTRICALLY CONDUCTIVE PATTERN FORMING APPARATUS

BACKGROUND OF THE INVENTION

1. Field of the Invention

The present invention relates to an apparatus for patterning a functional material, and more particularly to an electrically conductive pattern forming apparatus utilizing an electrophotographic process.

2. Description of Related Art

In recent years, as an alternative technique for a photolithograph method comprising an expensive mask and a multi-stage process, an electrically conductive pattern forming method based on a printing process with a simple process such as an intaglio printing method, a relief printing method, a screen printing method, a dispenser, inkjet printing, or electrophotographic printing attracts attention. Any of the processes uses a conductive particle dispersed solution in which conductive particles are dispersed in a solvent, or a toner in which conductive particles are doped in a resin, and achieves patterning by indirect coating using a printing plate or a screen, direct coating by nozzle scanning, or electrostatic attraction to an optional electrostatic latent image. Then, by heating and burning this, the fine particles are fused with each other to become a conductor to obtain wiring.

Among the above described various printing processes, the electrophotographic method which forms a desired electrically conductive pattern on an insulating substrate by using electrostatic force is especially adaptable to mass production and formation of a large area pattern since a roll enables continuous production. Further, since it is easy to change an electrically conductive pattern, which is advantageous for large item small scale production, there are many advantageous points as compared with the other processes. As an electrically conductive pattern forming method using an electrophotographic method, there are known a method in which a dry toner with conductive particles doped in a resin is patterned on a substrate with high heat resistance such as a ceramics green sheet, and then heated at a high temperature to remove the resin component and fuse metal components (see JP-A-11-251718, for example), and a method for forming a electrically conductive pattern by performing plating in which metal particles in a toner after patterning are used as nuclei (see JP-A-2004-48030, for example). However, when the dry toner as described above is used, the minimum particle diameter limit of the toner which can be handled in the air is 5 μm or more from the viewpoint of powder dust prevention, and it is physically impossible to form an electrically conductive pattern of 10 μm or less, for example.

In connection with the above described problem, there are proposed some patterning techniques which handle fine powder of an electrically conductive material in a state of an electrically conductive fine particle dispersed solution in which the fine powder is dispersed in a solution, that is, some electrically conductive pattern forming techniques based on liquid development (see JP-A-2006-278801 and JP-A-2002-527783, for example). Since the problem of fly powder dust which exerts influence on environment and human bodies can be solved by handling the particles in a solution, it becomes possible to handle the conductive particles having a nanoscale particle diameter, and to realize not only pattern formation with high definition, but also direct handling of conductor particles without possibly using a resin component which becomes ion adsorption charge in the solution to cause high resistance (JP-A-2006-278801, for example).

BRIEF SUMMARY OF THE INVENTION

However, when the above described methods are used, the process of handling a liquid becomes essential, and therefore, there is the problem of causing pattern breakage and apparatus contamination due to liquid dripping, backflow, and liquid leakage at the time of a liquid handling process.

The present invention is made to solve the above described problem, an object of which is to provide an electrically conductive pattern forming apparatus which directly performs patterning of particles diffused in a solution, particularly of conductive fine particles by means of an electrophotographic method, which comprises process disposition which reduces contamination of a pattern or inside of the apparatus due to dripping, backflow, and leakage of a liquid material such as a developing agent, a cleaning liquid or a transfer liquid to the minimum, and a configuration of the electrically conductive pattern forming apparatus by the process disposition.

In order to achieve the above-described object, the electrically conductive pattern forming apparatus is characterized in that developing/cleaning devices in the electrically conductive pattern forming apparatus of an electrophotographic type are disposed at a lower portion with respect to a photoreceptor center, a solvent removing means is disposed in a region where the photoreceptor rotates in a rising direction, and transfer liquid applying/electrostatic transfer means are installed in an upper portion with respect to the photoreceptor center and in a region where the photoreceptor rotates in a lowering direction.

By realizing the process disposition proposed in the present invention and the apparatus configuration based on the disposition, breakage of a formed pattern and contamination in the apparatus can be reduced when a liquid such as a developing solution, a cleaning liquid or a transfer liquid causes dripping and backflow to another process, or leaks inside the apparatus.

Other objects, features and advantages of the invention will become apparent from the following description of an embodiment of the invention taken in conjunction with the accompanying drawings.

DETAILED DESCRIPTION OF THE INVENTION

Hereinafter, an electrically conductive pattern forming method using an electrophotographic method according to the present invention will be described by using the drawings.

Figure 1:
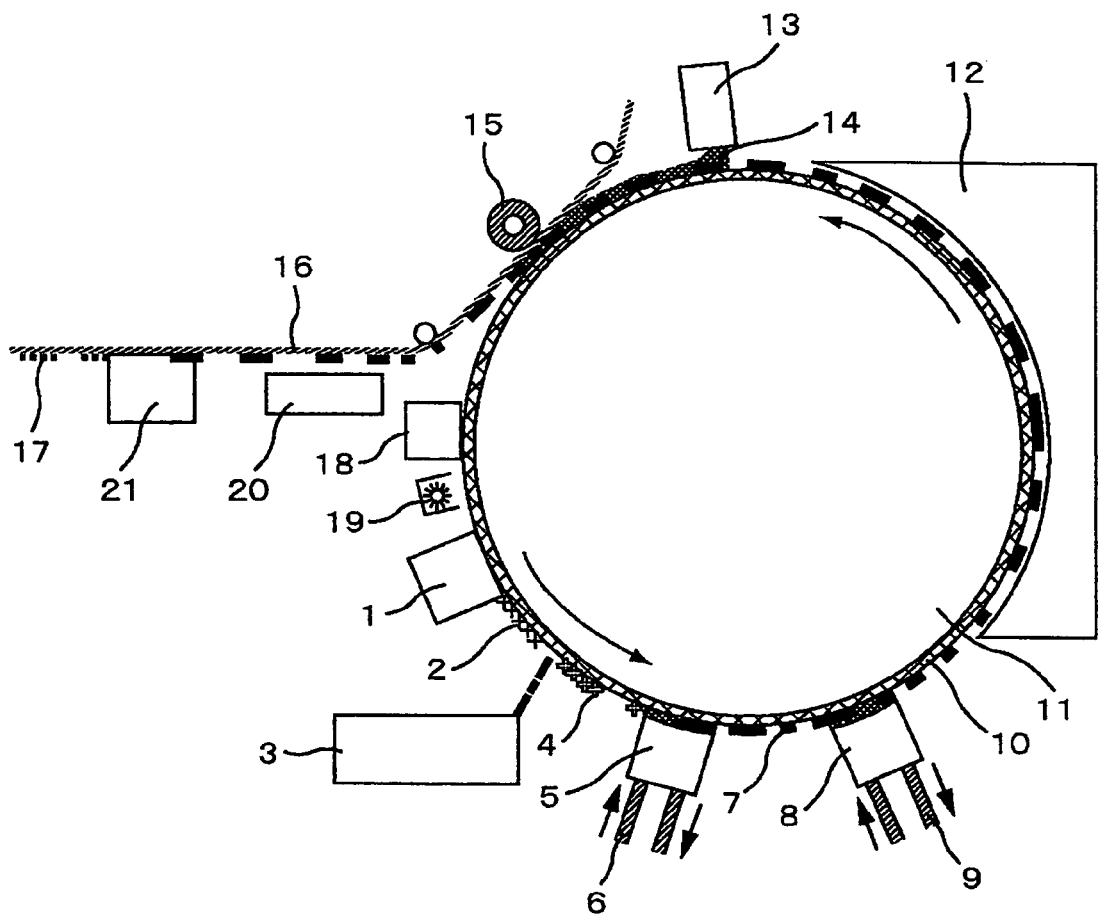
FIG. 1 is a configuration diagram of an electrically conductive pattern forming method using an electrophotographic method of the present invention.

FIG. 1 schematically shows an apparatus to which the electrically conductive pattern forming method using the electrophotographic method proposed in the present invention is applied. This apparatus is mainly configured by a charging device 1, a photoreceptor 11, a dielectric thin film body 10, an aligner 3, a developing device 5, a conductive particle dispersed solution 6, a cleaning device 8, a cleaning liquid 9, a solvent removing means 12, a transfer liquid applying means 13, a transfer means 15 which performs electrostatic transfer, a substrate 16, and a residual transfer liquid removing means 20.

In this embodiment, as a means for forming a charged region 2, a drum-shaped or a belt-shaped photoreceptor 11 provided with the dielectric thin film body 10 having photosensitivity on its surface and the charging device 1 are used. By the charging device 1 (configured by any one of a corotron+scorotron electro static charger, a roller contract electro static charger and a brush electro static contact charger) provided around the photoreceptor 11, a surface thereof is uniformly charged. The aligner 3 scans a charged region 2 which is uniformly charged by the charging device 1 with laser light in response to an image signal from an image information processing apparatus such as a personal computer, or On/Off control of each of a plurality of light sources arranged in an array shape is performed in response to the image signal, whereby an optional position is irradiated with light to form an intended electrostatic latent image pattern 4. As another method, electrostatic charge is applied to a convex portion of an electrostatic latent image transfer body with a surface formed into an intended pattern shape (convex portion) in advance. By bringing the electrostatic latent image transfer body into contact with the surface of the uniformly charged dielectric thin film body 10, the intended electrostatic latent image pattern 4 is formed. A so-called stamp charging method may be used. However, in order to realize easy modification of the electrostatic latent image pattern 4, the former method for forming the electrostatic latent image pattern 4 by irradiating the uniformly charged region 2 with light is preferably used. Here, in any of the methods, the provided charged region 2 may be charged by either positive charge or negative charge. The aligner 3 is provided directly before the developing device 5 described below with respect to the rotating direction of the photoreceptor 11. The reason thereof is that if the conductive particle dispersed solution 6 flows in the backflow direction from the developing device 5, the aligner 3 is contaminated so that the electrostatic latent image pattern 4 cannot be formed. Accordingly, the aligner 3 is desired to be installed at an upper portion with respect to the installation position of the developing device 5 in an area where the rotating direction of the photoreceptor 11 is in a falling direction.

The developing device 5 develops and forms an electrically conductive pattern precursor 7 by supplying the conductive particle dispersed solution 6 to the electrostatic latent image pattern 4 formed on the photoreceptor 11. The developing device 5 includes a tank for storing the conductive particle dispersed solution 6, and a supply means which supplies the conductive particle dispersed solution 6 to the electrostatic latent image pattern 4 on the dielectric thin film body 10 (which are not shown). As a means for supplying the conductive particle dispersed solution 6 to the electrostatic latent image pattern 4, there are the following three methods. The first method is a roll development method in which a layer of the conductive particle dispersed solution 6 is formed on a roll which is called a supply roll, and the roll is brought into contact with the electrostatic latent image pattern 4 for development. The second method is a slit development method in which the conductive particle dispersed solution 6 is supplied to the electrostatic latent image pattern 4 from a slit-shaped supply port 28 (see FIG. 4). The third method is an immersion development method in which the dielectric thin film body 10 on which the electrostatic latent image pattern 4 is formed is immersed in a liquid bath in which the conductive particle dispersed solution 6 is stored.

In order to give electrostatic assist force at the time of development of the electrically conductive pattern precursor 7, a surface of at least a region which is the closest to the photoreceptor 11 of each of the supply roll in the roll development method and the slit-shaped supply port 28 in the slit development method is preferably made of a electrically conductive member and has a configuration to which a voltage can be applied. Among the above described respective developing devices 5, the slit development method especially has a simple configuration and requires less volume, and has a larger supply amount of the conductive particle dispersed solution 6 per unit time as compared with the other methods. Therefore, the slit development method is advantageous for forming a high film thickness required for passing a large current in the electrically conductive pattern 17, and is a preferable method.

Figure 4:
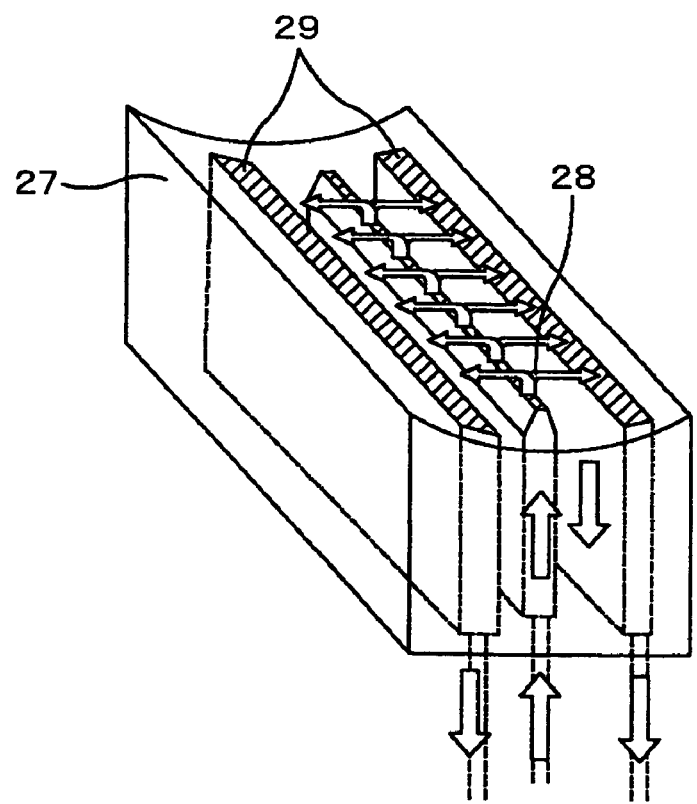
FIG. 4 is a schematic view of a slit type liquid/gas supply and collect device in the present invention.

FIG. 4 shows a schematic view of a slit liquid supply device used for a slit phenomenon. It is preferable to adopt a configuration in which a collection port 29 for collecting a solvent component which loses conductive particles and the excess conductive particle dispersed solution 6 by negative pressure is installed around the slit-shaped supply port 28 as shown in FIG. 4. By providing the collection port 29 like this, dripping, backflow and leakage of the conductive particle dispersed solution 6 can be reduced. By adopting the above described configuration, it is also possible to install the supply port 28 of the conductive particle dispersed solution 6 to face downward with respect to the photoreceptor 11. Therefore, from the view point of high degree of freedom of the disposition in the electrically conductive apparatus, the slit method is preferable. In the electrophotographic method, the developing device 5 is disposed between the aforementioned aligner 3 and the cleaning device 8 described below.

Here, when dripping, backflow and leakage of the conductive particle dispersed solution 6 occur, the cleaning device 8 in the subsequent process can collect the conductive particle dispersed solution 6 flowing together with the cleaning liquid 9. However, if contamination by the conductive particle dispersed solution 6 occurs, it is extremely difficult to restore the aligner 3 in the previous process. Therefore, it is necessary to adopt a configuration in which dripping, backflow and leakage of the conductive particle dispersed solution 6 to an aligner 3 side do not occur.

In additions, when the slit development method is adopted as a developing device 5, a configuration in which the slit-shaped supply port 28 faces downward with respect to the photoreceptor 11, that is, disposition of the developing device 5 on an upper side of the center of the photoreceptor 11 is possible. However, when leakage of the conductive particle dispersed solution 6 occurs, contamination to all the processes occurs. Therefore, the developing device 5 is preferably disposed on a lower side of the center of the photoreceptor 11. Particularly, installation at the lowest position with respect to all processes except the cleaning device 8 is preferable. Considering the above, it is preferable that the installation position of the developing device 5 is in a lower area from the center of the photoreceptor 11, and the developing device 5 is disposed in the lowering region in the rotating direction of the photoreceptor 11 or on a lower side of the aligner 3.

In order to keep the conductive particle concentration in the conductive particle dispersed solution 6 constant, a concentration detecting means which detects the conductive particle concentration is preferably provided in a storage tank of the developing device 5. A concentration adjusting means which adjusts the concentration by adding a nonpolar solvent 22 or adding conductive particles 24 into the storage tank based on the concentration information obtained from the concentration detecting means is provided. Further, a stirring means is provided in the storage tank to prevent sedimentation and uniformalize the concentration in all regions. As a stirring means, an ultrasound irradiating means, a stirring means using a stirring blade or the like for mechanically stirring the solution, a vibrating means which stirs the solution by vibrating the storage tank itself and the like can be used. In the case of the slit development method, in order to reduce the use amount of the material, it is preferable to adopt the circulating configuration in which the conductive particle dispersed solution 6 collected from the collection port 29 by negative pressure returns into the storage tank again after adjustment of the concentration based on a conductive particle concentration detection result, and is then used as a conductive particle dispersed solution 6.

Figure 2:
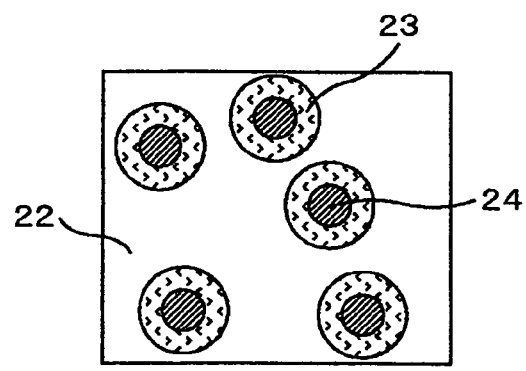
FIG. 2 is a schematic view of a conductive particle dispersed solution in the present invention.
Figure 3:
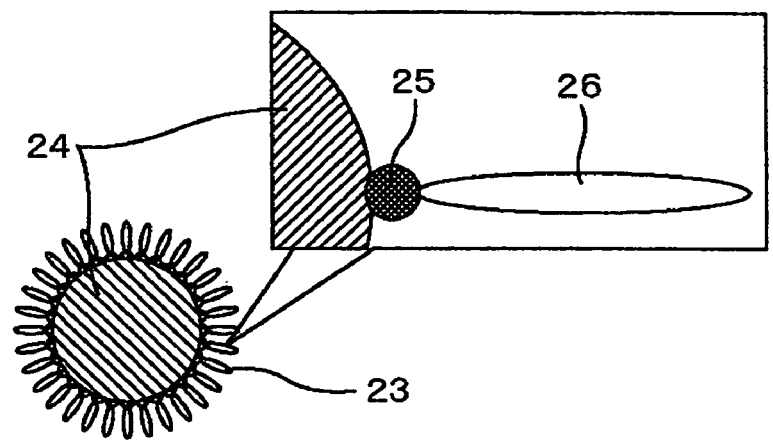
FIG. 3 is a schematic diagram of a conductive particle having an ionic organic molecule with a low molecular weight.

The details of the conductive particle dispersed solution 6 are shown in FIG. 2. The conductive particle dispersed solution 6 is the solution in which the conductive particles 24 each having a particle diameter of 100 nm or less to which ionic organic molecules 23 are adsorbed are dispersed in the nonpolar solvent 22.

As an ionic organic molecule 23, in the case of a polymer, there are cited a single polymer resin or mixed polymer resins with a functional group to which ionicity such as a carboxylic acid group and an amino acid group can be added, wherein the single polymer resin and the mixed polymer resins are selected from: polystyrene, poly-p-chlorostylene, polyvinyl toluene, stylene-p-chlorostylene copolymer, a single polymer of stylene such as stylene-vinyl toluene copolymer and a substituent product thereof and a copolymer thereof, a stylene-methyl acrylate copolymer, a stylene-ethyl acrylate copolymer, a copolymer of stylene such as a stylene-acrylic acid-n-butyl copolymer and acrylic ester, a stylene-methyl methacrylate copolymer, a stylene-ethyl methacrylate copolymer, a copolymer of stylene such as a or a stylene-methacrylic acid-n-butyl copolymer and methacrylic acid ester, a multicomponent copolymer of stylene, acrylic ester and methacrylic acid ester, a stylene-acrylonitrile copolymer, a stylene-vinyl methyl ether copolymer, a stylene-butadiene copolymer, a stylene-vinyl methyl ketone copolymer, a stylene system copolymer of stylene such as a stylene-maleic acid ester copolymer and another vinyl monomer, polymethyl methacrylate, methacrylic acid ester resins such as polybutylene methacrylate, methyl polyacrylate, ethyl polyacrylate, acrylic ester resins such as butyl polyacrylate, a polyester resin, an epoxy resin, a cycloolefin copolymer, and the like.

In the case of an organic molecule of a low molecule weight, there are cited aliphatic carboxylic acid inorganic salt composed of inorganic ion 18 such as Ag, Cu, Au, Pd, Pt, Ni, W, Mo or Cr, and aliphatic carboxylic acid ion 19 by aliphatic carboxylic acid such as dicarboxylic acid such as oxalic acid, malonic acid, succinic acid, adipic acid, glutaric acid, 2,4-diethyl glutaric acid, pimelic acid, azelaic acid, sebacic acid, cyclohexane dicarboxylic acid, maleic acid, fumaric acid or diglycolic acid, fatty acid such as caprylic acid, lauryl acid, myristic acid, palmitic acid, stearic acid, arachidic acid, behinic acid, linolic acid, oleic acid or linolenic acid, or hydroxyl-carboxylic acid such as lactic acid, hydroxyl pivalic acid, dimethylolurea propionic acid, citric acid, malic acid or glyceric acid.

In order to make the electrically conductive pattern precursor 7 into a conductor, it is necessary to heat and burn off the ionic organic molecules 23 which are organic components around the conductive particles 24. Since a low-molecular component needs lower thermal energy for baking than a high-molecular component, when using a resin substrate such as polyimide with a low heat resistant temperature as a substrate 16 which is an object for forming the electrically conductive pattern 17, it is preferable to use low-molecular organic molecules with a low baking temperature. Further, when using low-molecular organic molecules, the ratio of the residual organic molecular in the pattern which makes the resistance of the conductive pattern 17 high is low as compared with the case of using high-molecular organic molecules. Form the above point of view, the component of the ionic organic molecule 23 around the conductive particle 24 is preferably the organic molecule with a low molecule weight.

The particle diameter of the conductive particle 24 needs to be 100 nm or less so as to make low temperature fusion possible and make the electrically conductive pattern 17 have high resolution. However, in order to fuse the conductive particle 24 by heating it at a temperature of 200 degrees or less to make the electrically conductive pattern precursor 7 into a conductor, the particle diameter of the conductive particle 24 is preferably made 10 nm or less. When the electrically-conductive pattern 17 with a line width of 100 nm or less is required, the particle diameter of the conductive particle 24 is preferably made 5 nm or less.

For the conductive particle 24, Ag or Cu, or a single metal such as Au, Pd, Pt, Ni, W, Mo and Cr, an oxide of these metals, or an alloy of these metals may be used. When a conductor is needed, Ag or Cu with a low volume resistance rate is used. A plurality of above described metals, oxides and alloys can be mixed to be used.

For the nonpolar solvent 22, an aliphatic hydrocarbon solvent is used. As an aliphatic hydrocarbon solvent, isoparaffin or petroleum naphtha, Isopar (Exxonmobile Chemical Corporation), IP solvent (Idemitsu Kosan Co.) acid, Soltol (Philips Petroleum Co.) and other hydrocarbons are cited.

The cleaning device 8 removes excess conductive particles which float on the electrically conductive pattern precursor 7 immediately after being developed on the photoreceptor 11 or in the remaining nonpolar solvent 22 without being developed. The cleaning device 8 is configured to supply the solvent which does not include conductive particles as a cleaning liquid 9, and remove the excess conductive particles by suction. The cleaning device 8 includes a tank (not illustrated) which stores the cleaning liquid 9, and a supply means which supplies the cleaning liquid 9 to the electrically conductive pattern precursor 7 on the dielectric thin film body 10. As a supply means of the cleaning liquid 9, as with the case of the developing device 5, there are cited a slit cleaning method in which the cleaning liquid 9 is supplied from a slit-shaped supply port and the cleaning liquid 9 is supplied to a gap between the electrically conductive pattern precursor 7 on the photoreceptor 11 and the supply port of the cleaning device 8, an immersion cleaning method in which the dielectric thin film body 10 on which the electrically conductive pattern precursor 7 is formed is immersed in a liquid bath in which the cleaning liquid 9 is stored, and the like.

However, as described with regard to the developing device 5, the slit cleaning method is preferable from the viewpoint of the simple configuration, small volume and high degree of freedom of installation. A surface of at least a region which is the closest to the photoreceptor 11 of the slit-shaped supply port of the cleaning liquid 9 in the slit cleaning method is preferably formed from a conductive member. This reason is to obtain a configuration in which a voltage can be applied so as to be able to electrostatically attract and remove the excess conductive particles which float on the electrically conductive pattern precursor 7 or adhere to the non-pattern formation region. In the slit method, a configuration in which a collection port for collecting the solution after cleaning by negative pressure is installed around the slit-shaped supply port is preferable. A circulating configuration in which the cleaning liquid after use which is collected from the collection port by negative pressure is purified by a means such as filtration and adsorption, and returns into the storage tank again as a cleaning liquid 9 is preferable. As a cleaning liquid 9, any solvent can be used without being especially limited as long as the solvent can mix with the solvent of the conductive particle dispersed solution 6. However, from the viewpoint of holding the state in which the electrically conductive pattern precursor 7 is not broken, it is preferable that the solvent is the same as that of the conductive particle dispersed solution 6.

In the electrophotographic method, the cleaning device 8 is disposed between the aforementioned developing device 5 and the solvent removing means 12 which will be described later. Here, when the cleaning liquid 9 leaks out, in the developing device 5 of the previous process, especially in the case of the slit method, the cleaning liquid can be collected together with the excess conductive particle dispersed solution 6 from the collection port 29 by negative pressure, and therefore, backflow and dripping of the cleaning liquid 9 to the developing device 5 side do not matter. However, if the cleaning liquid 9 flows in the direction of the solvent removing means 12 of the subsequent process, it exceeds the solvent removing ability in the solvent removing means 12, and there is a fear of the problem that a residual cleaning liquid 9 cannot be sufficiently removed from the electrically conductive pattern precursor 7 until it reaches the transfer liquid applying means 13 which will be described later. Therefore, a configuration which does not cause liquid flow to the solvent removing means 12 side is needed. In the case of the slit cleaning method, a configuration in which the supply port is disposed to face downward with respect to the photoreceptor 11, that is, disposition of the cleaning device 8 at an upper portion from the center of the photoreceptor 11 becomes possible. However, as with the case of the developing device 5, if the cleaning liquid 9 leaks out, contamination risk to all processes increases, and therefore, it is desirable to install the cleaning device 8 at a lower side from the center of the photoreceptor 11, or at the lowest position with respect to all processes except for the developing device 5. Considering the above, it is preferable that the installation position of the cleaning device 8 is in a lower region from the center of the photoreceptor 11, and the cleaning device 8 is disposed in a rising area in the rotating direction of the photoreceptor 11, or in a lower portion from the solvent removing means 12. However, if occurrence of the excess particles can be sufficiently reduced at the time of development in the developing device 5, the cleaning device 8 described above may not be installed in the electrically conductive pattern forming apparatus of the present invention.

In forming means of the conductive pattern 17 by the electrophotographic method in the present invention, it is necessary to transfer the electrically conductive pattern precursor 7, which is developed on the dielectric thin film body 10, with high efficiency without breaking it. For this purpose, it is preferable to adopt a dry agglomeration electrostatic transfer method in which a solvent component remaining on the electrically conductive pattern precursor 7 is removed once immediately after passing through the developing device 5 and the cleaning device 8 before transfer onto the target substrate 16, a transfer liquid 14 is reapplied again on the electrically conductive pattern precursor 7, and a voltage is further applied to the substrate 16 and the like to transfer the electrically conductive pattern precursor 7 by electrophoresis.

As described above, the electrically conductive pattern forming apparatus in the present invention includes the solvent removing means 12. By removing the remaining solvent component from the electrically conductive pattern precursor 7 immediately after development by the solvent removing means 12, the conductive particles 24 configuring the electrically conductive pattern precursor 7 are agglomerated, and inter-particle force is increased. Therefore, the pattern retentivity is enhanced, and pattern breakage at the time of transfer can be prevented. Further, by removing the remaining solvent component, the electrostatic latent image pattern 4 remaining on the dielectric thin film body 10 is erased, the electrically conductive pattern precursor 7 becomes easily peeled from the dielectric thin film body 10, and the transfer efficiency is enhanced. As a solvent removing means 12 which removes the remaining solvent component from the electrically conductive pattern precursor 7 immediately after the developing device 5 and the cleaning device 8, there are cited a heating method by a heating means which evaporates and dries the solvent by heating and blowing hot air, and a gas flow method having a fan means which blows gas flow to a liquid film to blow away the liquid film to blow away the remaining solvent component from the electrically conductive pattern precursor 7.

In the heating method, it is feared that it takes a long time to evaporate a solvent and deterioration of the dielectric thin film body 10 is accelerated by heat. Therefore, it is preferable to use the gas flow method which gives less damage to the photoreceptor 11 and is capable of removing the solvent quickly. Regarding the direction in which the gas flow is applied, it is not preferable that the remaining solvent component which is blown away flows in the direction of transfer (in the direction of the electrically conductive pattern precursor 7 from which the solvent component is already removed) or in the developing direction (in the direction of the electrically conductive pattern precursor 7 immediately after development, which has the remaining solvent component). Accordingly, it is preferable to adopt a method in which the liquid film is blown in the direction (in the width direction) of an end portion of the dielectric thin film body 10 from the center, or the liquid film is blown from one end portion of the dielectric thin film body 10 to the other end portion of the dielectric thin film body 10 in the same width direction, so that the liquid film is collected by the solvent removing means 12 installed at the end portion of the dielectric thin film body 10.

As a solvent removing means 12, a method in which a groove is formed at an end portion of the dielectric thin film body 10 and the residual solvent is collected in the groove, and a method including a sponge member which can absorb the residual solvent are conceivable. Further, a configuration in which the residual solvent which flows to the end portion of the dielectric thin film body 10 by negative pressure is sucked and collected in order to reduce the liquid removing time may be adopted. As another configuration of the solvent removing means 12, it may be preferable to adopt a configuration in which a member with a slit-shaped configuration as shown in FIG. 4 described with regard to the developing device 5 and the cleaning device 8 is brought close to the electrically conductive pattern precursor 7 on the dielectric thin film body 10, gas flow is jetted from the slit-shaped supply port 28 having a width which is the same width as the photoreceptor 11 or more, and the residual solvent is collected by the negative pressure from the collection port 29 installed at a position adjacent to the slit port. Further, if one slit type solvent removing means 12 is used for removing all residual solvent, strong gas flow blowing force and negative pressure are required, and thus the electrically conductive pattern precursor 7 is highly likely to be broken. Therefore, it may be suitable to adopt a configuration in which a plurality of slit type solvent removing means 12 having such gas flow blowing force and negative pressure as not to break the electrically conductive pattern precursor 7 are arranged in parallel in the rotating direction of the photoreceptor 11. It is preferable to adopt a configuration in which the collected solvent is conveyed to the developing device 5 and the cleaning device 8 to be recycled.

The solvent removing means 12 is a process located between the aforementioned developing device 5 and cleaning device 8, and the transfer liquid applying means 13 which will be described later, in electrophotography. Here, in the region of the solvent removing means 12, the residual solvent is held at the front end portion of the solvent removing means 12, while the residual solvent is removed at the rear end portion of the solvent removing means 12. Therefore, in order that the residual solvent does not flow to the device rear end portion from the front end portion of the solvent removing means 12, the rear end portion of the solvent removing means 12 is preferably disposed at an upper position from the front end portion. Further, the solvent removing means 12 is required to be installed in a rising region in the rotating direction of the photoreceptor 11. Further, in order to avoid contamination by liquid flow and leakage of the conductive particle dispersed solution 6 or the cleaning liquid 9 from the developing device 5 and the cleaning device 8, the solvent removing means 12 needs to be disposed at an upper side from developing device and the cleaning device 8. Further, in order to avoid pattern contamination by liquid leakage and backflow from the transfer liquid applying means 13 which is the subsequent process, the rear end portion of the solvent removing means 12 needs to be disposed at an upper side from the transfer liquid applying means 13. Further, in the solvent removing process in the solvent removing means 12, in order to remove the solvent from the electrically conductive pattern precursor 7 carefully and sufficiently so as not to break the developed pattern, a wide-range region is required as compared with the other processes as shown in FIG. 1.

The conductive particle 24 forming the electrically conductive pattern precursor 7 in the present invention is charged with electricity only in a solvent. Therefore, when electrostatic transfer is performed, existence of the solvent is essential in the gap between the dielectric thin film body 10 and the substrate 16. Therefore, it is necessary to add the transfer liquid 14 again onto the electrically conductive pattern precursor body 7, from which the residual solvent has been removed, to form a liquid film. As a transfer liquid applying means 13, a method in which the dielectric thin film body 10 holding the electrically conductive pattern precursor 7 is passed through and immersed in a member of a saucer shape filled with the transfer liquid 14, a method in which the transfer liquid 14 is sprayed by a spray to form a liquid film again, a method in which the transfer liquid 14 is applied by a dispenser with a slit-shaped nozzle or a plurality of nozzles arranged in parallel, and the like are conceivable.

Here, the electrically conductive pattern precursor 7 after the transfer liquid 14 is applied thereon reduces in interaction with a surface of the dielectric thin film body 10 in connection with erasure of the residual latent image when removing the solvent, and therefore, the electrically conductive pattern precursor 7 is easily peeled off by physical external force. Therefore, in a coating method of the transfer liquid 14 by spraying, physical force acts on the pattern with blow of gas flow, breakage of the pattern is feared. Further, in the case of a method in which the electrically conductive pattern precursor 7 is passed through and immersed in the saucer filled with the transfer liquid 14, disposition of the transfer liquid applying means is limited to a position in which the direction of the photoreceptor 11 is switched to the rising direction from the falling direction. Therefore, the degree of freedom of the process disposition significantly reduces. Therefore, it is preferable to use the method of applying the transfer liquid 14 by a dispenser with a slit-shaped nozzle or a plurality of nozzles arranged in parallel. Other than a dispenser, applying of the transfer liquid 14 by inkjet may be adopted. The transfer liquid applying means 13 is a process located between the aforementioned solvent removing means 12 and the transfer means 15 which will be described later. Here, when the transfer liquid 14 flows to the transfer means 15 side, it does not matter even if the transfer liquid 14 flows because in the transfer means 15, existence of the solvent is originally required at the time of electrostatic transfer, and the excessive transfer liquid 14 is collected in cleaning means 18 which is a subsequent process. However, backflow of the transfer liquid 14 to the solvent removing means 12 side of the previous process causes the excessive transfer liquid 14 to flow onto the electrically conductive pattern precursor 7 during removal of the solvent. Therefore, there is the possibility that normal solvent removal cannot be performed, and thus, it is necessary to adopt a configuration in which flow of the transfer liquid 14 to the solvent removing means 12 side does not occur. Further, when the method of coating the transfer liquid 14 by the dispenser with a slit-shaped nozzle or a plurality of nozzles arranged in parallel is adopted, the transfer liquid 14 can be applied from a lower side with respect to the photoreceptor 11. However, in order to obtain a liquid film by normally applying the transfer liquid 14, a configuration in which the transfer liquid 14 is applied from an upper side with respect to the photoreceptor 11 is adopted, and the liquid film by the transfer liquid 14 after applying is preferably formed on the upper side from the center of the photoreceptor 11.

Considering the above, as for disposition of the transfer liquid applying means 13, it is preferable to dispose the transfer liquid applying means 13 on an upper side from the center of the photoreceptor 11 and in a region moving downward in the rotating direction of the photoreceptor 11, or at an upper side from the transfer means 15 and on a lower side from the rear end portion of the solvent removing means 12, or in a position diagonally opposite to the disposition position of the cleaning device 8 via the photoreceptor 11. Here, as a transfer liquid 14, it is not limited as long as the solvent does not break the electrically conductive pattern precursor 7 and is capable of electrophoresis in the transfer liquid 14, but the one with a similar component to that of the nonpolar solvent 22 in the conductive particle dispersed solution 6 is preferable.

Figure 5:
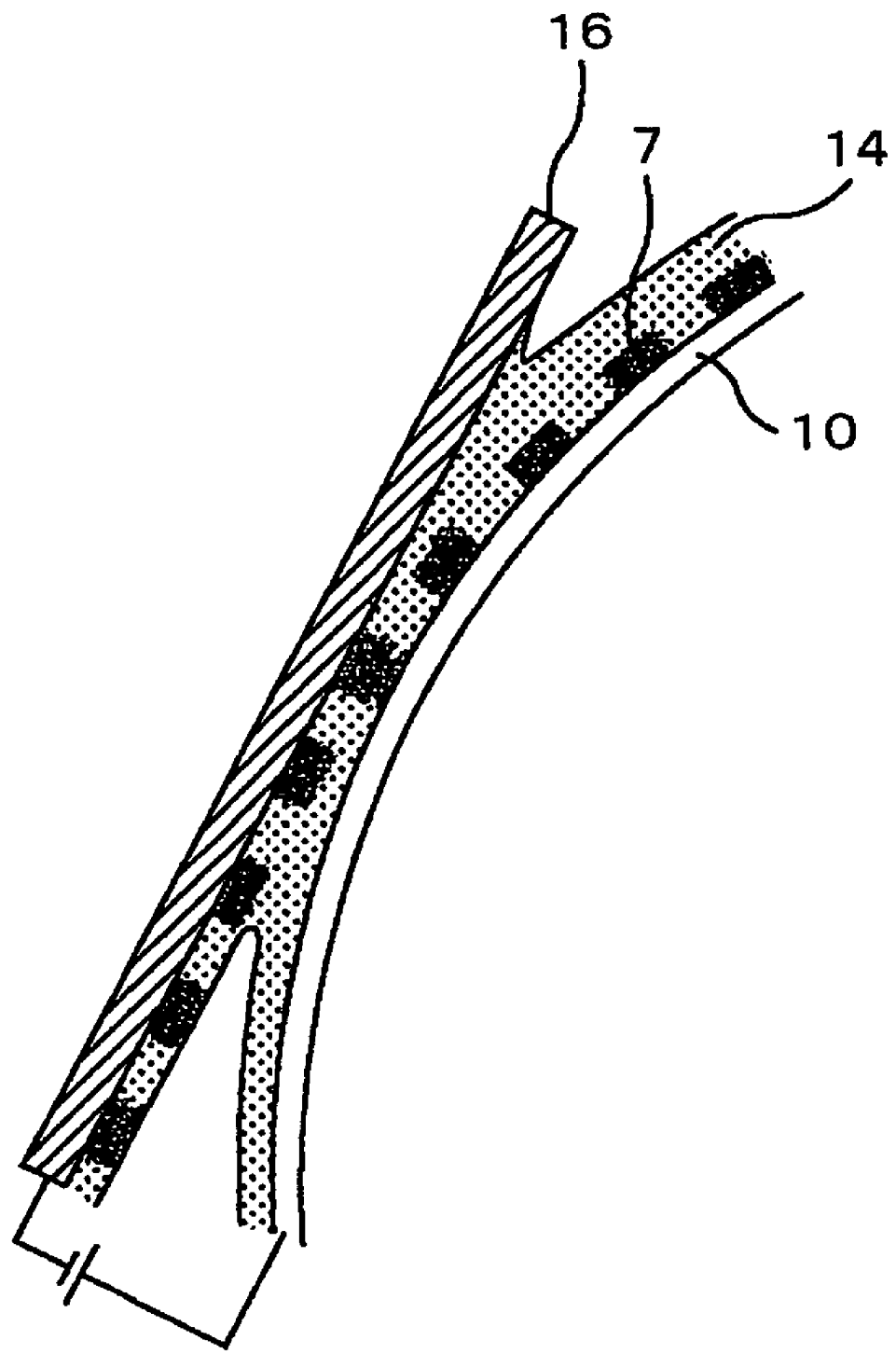
FIG. 5 is a schematic view of a transfer means by electrophoresis in the present invention.

In the electrically conductive pattern forming apparatus of the present invention, the method of electrostatically transferring the electrically conductive pattern precursor 7 developed onto the photoreceptor 11 is used. Therefore, by applying the transfer liquid 14 immediately before transfer, it becomes possible to act electrostatic force on the electrically conductive pattern precursor 7 constituted of the conductive particles 24 recharged in the liquid. The transfer means 15 for moving the pattern onto the substrate 16 to be printed from the dielectric thin film body 10 while holding the pattern by electrostatic force is provided. As a transfer means 15, as shown in FIG. 5, the electrically conductive pattern precursor 7 is in the state of being sandwiched by the surface of the dielectric thin film body 10 and the surface of the substrate 16. A gap between the dielectric thin film body 10 and the surface of the substrate 16 is in the state of being filled with the transfer liquid 14 given by the transfer liquid applying means 13. In this state, a voltage is applied from the back side of the substrate 16 which is a printing target. Thereby, the electrically conductive pattern precursor 7 is transferred to the substrate 16 side from the dielectric thin film body 10 side by electrophoresis. The sign of the voltage which is applied to the transfer means 15 is a positive bias when the conductive particles 24 configuring the electrically conductive pattern precursor 7 are negatively charged with the transfer liquid 14, and is a negative bias when those are positively charged.

The transfer means 15 in the present embodiment has a roll structure in which an electrically conductive elastic body is provided on its surface as a member which applies a voltage. The roll is configured to rotate in a driven rotation direction in a rotating direction of the photoreceptor 11 at the time of transfer. At this time, in order to push out an air layer entering the gap, a configuration in which pressurizing force of 100 g weight/cm or more can be applied to the photoreceptor 11 is preferable. The transfer means 15 is a process located between the aforementioned transfer liquid applying means 13 and the cleaning means 18 which will be described later. Here, the transfer means 15 needs to be located on a lower side from the transfer liquid applying means 13 so that when excessive transfer liquid flows from the transfer liquid applying means 13 of the previous process, the excessive liquid is guided to the transfer means 15 side. Further, the transfer means 15 needs to be configured to be disposed on an upper side from the cleaning means 18 so that the transfer liquid 14 remaining on the dielectric thin film body 10 after transfer does not flow backward in the processes and all liquid is guided to the cleaning means 18 side which is the subsequent process. From the above, the transfer means 15 is disposed on an upper side from the center of the photoreceptor 11, and is disposed in a falling region in the rotating direction of the photoreceptor 11. Alternatively, the transfer means 15 is disposed on an upper side from the cleaning means 18 and on a lower side from the transfer liquid applying means 13. Alternatively, the transfer means 15 is preferably disposed at a position diagonally opposite to a position in which the cleaning device 8 is disposed, via the photoreceptor 11.

As an object to be transferred in the present invention, there are cited a method of directly transferring onto the substrate 16 on which the electrically conductive pattern 17 is formed, or a method in which the electrically conductive pattern precursor 7 is primarily held on an electrically conductive pattern holding substrate (intermediate transfer base), and thereafter, the transferred electrically conductive pattern precursor 7 is further transferred onto the target substrate 16. In the case of the method of directly transferring onto the target substrate 16, it is preferable that the substrate 16 has the resistance against heating at 150 to 250° C., and is a sheet-shaped member of a thickness of 1 mm or less to correspond to transfer bias application from the back side of the substrate 16. As an example of the member constituting the substrate 16, a resin sheet constituted of polyimide, ceramics green sheet and the like are cited.

The electrically conductive pattern forming apparatus in the present invention includes a baking means 21 for fixing the electrically conductive pattern precursor 7 transferred onto the substrate 16 to the substrate 16, and fusing the conductive particles 24 to be a conductor to make the electrically conductive pattern 17. The baking means 21 not only fuses the conductive particles 24, but also bakes the dispersing agent layer applied to the surfaces of the conductive particles 24. At this time, a mechanism which can pressurize the electrically conductive pattern 17 onto the substrate 16 simultaneously with heating may be included. The heating temperature at this time is preferably 300° C. or less so as to fuse the conductive particles 24 sufficiently, burn the ionic organic molecules 23, but prevent deformation and degeneration of the substrate 16. At this time, an exhaust means which exhausts the baked organic components may be installed. Further, the liquid film by the transfer liquid 14 at the time of transfer remains on the electrically conductive pattern precursor 7 on the substrate before heating, and therefore, the residual transfer liquid removing means 20 which removes the liquid film before baking is preferably included.

In the electrically conductive pattern forming apparatus in the present invention, the dielectric thin film body 10 has a configuration in which the dielectric thin film body 10 passes through the cleaning means 18 after transfer of the electrically conductive pattern precursor 7, whereby the surface state of the dielectric thin film body 10 is returned to an initial surface state, a latent image is formed thereon again and the conductive particle dispersed solution 6 is developed. As a shape of the photoreceptor 11, a belt shape or a drum shape is preferable. The material of the photoreceptor 11 is not especially limited as long as it is a material which has resistance against the solvent and does not cause environmental contamination, and an inorganic material such as amorphous silicon is preferable. In this case, the cleaning means 18 of the residual conductive particles for removing and collecting the residual conductive particles 24 on the dielectric thin film body 10 after transfer, and the residual latent image erasing means 19 for erasing the residual electrostatic latent image are included.

A configuration in which the cleaning means is allowed to have a residual latent image erasing function, and the residual latent image erasing means 19 is not provided may be adopted. As a cleaning means 18 of the residual conductive particles, a method in which a blade is brought into contact with the dielectric thin film body 10 to scrape off the residual conductive particles, and a method in which the residual conductive particles are washed away by a solvent are cited. In this case, a member which acts as a saucer for the conductive particles and residual solvent having been scraped off, or the cleaning solvent used for washing is preferably configured to face its receiving surface upward. Accordingly, the cleaning means 18 is preferably disposed in a falling region in the rotating direction of the photoreceptor 11. In this case, the conductive particles 24 and solvent having been removed and collected may be returned to the developing device 5, the cleaning device 8 and the transfer liquid applying means 13 after being purified and separated, and may be recycled.

The electrically conductive pattern 17 formed by the conductive particle dispersed solution 6 of the present invention can be used as wiring for a substrate of, for example, a personal computer, a large electronic computer, a notebook type personal computer, a pen input personal computer, a notebook word processor, a cellular phone, a portable card, a wrist watch, a camera, an electric shaver, a cordless telephone, a facsimile, a video recorder, a video camera, an electronic notebook, a calculator, an electronic notebook with a communication function, a portable copying machine, a liquid crystal television, an electric tool, a cleaner, a game device having a function of virtual reality or the like, a toy, an electric bicycle, a walking assist machine for medical care, a wheelchair for medical care, a movable bed for medical care, an escalator, an elevator, a folk lift, a golf cart, an emergency power supply, a road conditioner, a stationary energy storage system or the like. Further, the electrically conductive pattern 17 can be also applied to military use and space use in addition to consumer use.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An electrically conductive pattern forming apparatus comprising:
   a photoreceptor provided with a dielectric thin film body on its surface;
   a developing device which forms an electrostatic latent image pattern on the photoreceptor and develops the electrostatic latent image pattern by a conductive particle dispersed solution;
   a solvent removing means which removes a liquid film from an electrically conductive pattern precursor developed on the photoreceptor;
   a transfer liquid applying means which forms a transfer liquid film on the electrically conductive pattern precursor from which the liquid film has been removed; and
   a transfer means which transfers the electrically conductive pattern precursor to which the transfer liquid film is applied onto a target substrate; wherein
   the developing device is disposed on a lower side from a center of the photoreceptor, and the transfer liquid applying means and the transfer means are disposed on an upper side from the center of the photoreceptor and in a region in which the photoreceptor rotates downward;
   the solvent removing means and a blower means are provided in an intermediate portion between the developing device and the transfer means, and a gas flow blowing direction thereof is in a direction from one end side to the other end side in a width direction of the photoreceptor, or in directions from the center in the width direction of the photoreceptor to both end sides; and
   the solvent removing means is provided with a collection means in a photoreceptor end portion for collecting a liquid film by negative pressure.

2. An electrically conductive pattern forming apparatus comprising:
   a photoreceptor provided with a dielectric thin film body on its surface;
   a developing device which forms an electrostatic latent image pattern on the photoreceptor and develops the electrostatic latent image pattern by a conductive particle dispersed solution;
   a solvent removing means which removes a liquid film from an electrically conductive pattern precursor developed on the photoreceptor;
   a transfer liquid applying means which forms a transfer liquid film on the electrically conductive pattern precursor from which the liquid film has been removed; and
   a transfer means which transfers the electrically conductive pattern precursor to which the transfer liquid film is applied onto a target substrate; wherein
   the developing device is disposed on a lower side from a center of the photoreceptor, and the transfer liquid applying means and the transfer means are disposed on an upper side from the center of the photoreceptor and in a region in which the photoreceptor rotates downward;
   the solvent removing means is located in a region in which the photoreceptor rotates upward;
   the solvent removing means and a blower means are provided in an intermediate portion between the developing device and the transfer means, and a gas flow blowing direction thereof is in a direction from one end side to the other end side in a width direction of the photoreceptor, or in directions from the center in the width direction of the photoreceptor to both end sides; and
   the solvent removing means has a slit type configuration in which a supply port for supplying a gas flow, and a collection port for collecting a liquid film by negative pressure are provided on its surface opposite to the photoreceptor.

3. The electrically conductive pattern forming apparatus according to claim 2, wherein a plurality of slit type solvent removing means are arranged in a photoreceptor rotating direction.

* * * * *